(12) United States Patent
Ohmi

(10) Patent No.: US 7,977,796 B2
(45) Date of Patent: Jul. 12, 2011

(54) SEMICONDUCTOR DEVICE AND MULTILAYER WIRING BOARD

(75) Inventor: Tadahiro Ohmi, Sendai (JP)

(73) Assignees: National University Corporation Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 140 days.

(21) Appl. No.: 12/310,483

(22) PCT Filed: Aug. 24, 2007

(86) PCT No.: PCT/JP2007/066478
§ 371 (c)(1),
(2), (4) Date: Feb. 26, 2009

(87) PCT Pub. No.: WO2008/026520
PCT Pub. Date: Mar. 6, 2008

(65) Prior Publication Data
US 2009/0283901 A1 Nov. 19, 2009

(30) Foreign Application Priority Data

Aug. 28, 2006 (JP) .................................. 2006-231008

(51) Int. Cl.
*H01L 23/48* (2006.01)
(52) U.S. Cl. .. 257/758; 257/750; 257/759; 257/E23.167
(58) Field of Classification Search .................. 257/700, 257/701, 706, 707, E23.145
See application file for complete search history.

(56) References Cited

U.S. PATENT DOCUMENTS

| 5,625,232 A | 4/1997 | Numata et al. |
| 5,675,187 A | 10/1997 | Numata et al. |
| 5,744,865 A * | 4/1998 | Jeng et al. ..................... 257/750 |
| 5,874,777 A * | 2/1999 | Ohmi et al. .................... 257/758 |
| 2001/0013654 A1* | 8/2001 | Kalidas et al. ................ 257/738 |
| 2001/0034137 A1* | 10/2001 | Nambu ......................... 438/725 |
| 2003/0211719 A1* | 11/2003 | Ohayashi et al. ............. 438/597 |

(Continued)

FOREIGN PATENT DOCUMENTS

| EP | 1 197 994 | 4/2002 |
| EP | 1 369 917 A2 | 12/2003 |
| JP | 08-083797 | 3/1996 |

(Continued)

OTHER PUBLICATIONS

European Patent Office extended European search report on Application No. 07806064.7 dated Jul. 6, 2010; 3 pages.

*Primary Examiner* — Leonardo Andújar
*Assistant Examiner* — William Harriston
(74) *Attorney, Agent, or Firm* — Foley & Lardner LLP

(57) ABSTRACT

A gas or an insulating material having a relative dielectric constant of not more than 2.5 on average is interposed between a first wiring layer and a second wiring layer included in a multilayer wiring structure. Between a wiring of the first wiring layer and a wiring of the second wiring layer, a conductive connector is arranged. Between a predetermined wiring of the first wiring layer and a predetermined wiring of the second wiring layer, an insulating heat conductor having a relative dielectric constant of not more than 5 is arranged.

10 Claims, 5 Drawing Sheets

U.S. PATENT DOCUMENTS

| | | | |
|---|---|---|---|
| 2005/0236180 A1* | 10/2005 | Sarma et al. | 174/256 |
| 2006/0103017 A1 | 5/2006 | Usui et al. | |
| 2008/0017989 A1* | 1/2008 | Lee et al. | 257/758 |
| 2008/0211099 A1* | 9/2008 | Matsubara | 257/751 |
| 2009/0108413 A1* | 4/2009 | Ohmi | 257/632 |
| 2009/0108452 A1* | 4/2009 | Nemoto et al. | 257/751 |
| 2009/0309088 A1* | 12/2009 | Sakamoto | 257/2 |

FOREIGN PATENT DOCUMENTS

| | | |
|---|---|---|
| JP | 09-129725 | 5/1997 |
| JP | 2005-317835 A | 11/2005 |
| JP | 2006-140326 | 6/2006 |
| WO | WO-00/74135 | 12/2000 |
| WO | WO 01/78141 A2 | 10/2001 |

* cited by examiner

SEMICONDUCTOR DEVICE AND MULTILAYER WIRING BOARD

TECHNICAL FIELD

This invention relates to a semiconductor device, such as an IC and an LSI, having a multilayer wiring structure and to a multilayer wiring board having the multilayer wiring structure on a substrate including at least one of a semiconductor, a conductor, and an insulator.

BACKGROUND ART

In semiconductor devices, such as an IC and an LSI, a multilayer wiring structure is used for the purpose of dealing with the increase in length and in area of a wiring associated with the integration of various elements therein. In the semiconductor devices, in order to deal with higher integration, miniaturization of a wiring pattern is promoted to reduce a wiring cross-sectional area. On the other hand, in order to realize a high-speed operation, an electric current flowing through the wiring tends to increase. Thus, in the semiconductor devices, an electric current flowing through each wiring tends to increase in density.

The increase in electric current density in each wiring increases Joule heat production to cause various problems including deterioration of the wiring. Therefore, it is required to efficiently remove the heat produced in the wiring.

Further, an operation speed of the semiconductor device of the type is severely restricted by a product of a resistance value R of the wiring and a capacitance C attributed to the wiring, namely, an RC time constant. Hence, in order to increase the operation speed of the semiconductor device, it is required not only to reduce the resistance value R of the wiring, but also to reduce the capacitance C.

The problem as mentioned above exists not only in an individual semiconductor chip having a multilayer wiring structure, but also in a multilayer wiring structure of a semiconductor package on which the semiconductor chip is mounted. Further, the above-mentioned problem also exists in a substrate (a so-called printed board or the like) having the multilayer wiring structure on which a number of semiconductor devices are mounted, and in other multilayer wiring boards. That is, even in case where heat of the wiring is removed in the individual semiconductor chip and the resistance value R and the capacitance C of the wiring are reduced to increase the operation speed in the individual semiconductor chip, the operation speed is reduced as a whole and the problem due to heat can not be prevented if the multilayer wiring structure of the package or of the wiring board does not sufficiently address heat and has a large resistance value R and a large capacitance C.

In order to solve the above-mentioned problem, proposal has previously been made of a multilayer wiring structure in which, as an interlayer insulation film, a polymer material, such as $SiO_2$, $Si_3N_4$, and polyimide, is used. The structure is provided with not only a through hole for interlayer electrical connection, but also a thermal via which is formed by filling a penetrating hole formed in the interlayer insulation film with an insulating material (AlN) having a thermal conductivity greater than that of the interlayer insulation film. Thus, interlayer heat conduction is carried out (for example, see Patent Document 1: Japanese Unexamined Patent Application Publication (JP-A) No. H9-129725).

Further, another multilayer wiring structure has previously been proposed in which, in order to further increase a signal transmission rate, air is used for interlayer insulation for the purpose of achieving a low-dielectric constant of an interlayer insulating portion (for example, see Patent Document 2: International Publication WO00/74135).

Patent Document 1: Japanese Unexamined Patent Application Publication (JP-A) No. H9-129725
Patent Document 2: International Publication WO00/74135

DISCLOSURE OF THE INVENTION

Problem to be Solved by the Invention

In the multilayer wiring structures proposed in Patent Documents 1 and 2, AlN (and $Si_3N_4$) having a high thermal conductivity is used as a material of the thermal via. However, since AlN has a relative dielectric constant as very high as 8.7 (in $Si_3N_4$, 7.9), there is a problem that an average dielectric constant is increased even if a material having a low-dielectric constant is used for interlayer insulation.

It is therefore an object of the present invention to provide a thermal via having a low relative dielectric constant and to provide a multilayer wiring structure capable of simultaneously achieving a low dielectric constant and a high thermal conductivity of interlayer insulation.

It is another object of the present invention to provide a multilayer wiring board in which interlayer insulation of a multilayer wiring structure can simultaneously achieve a low dielectric constant and a high thermal conductivity.

It is still another object of the present invention to provide a semiconductor device having a multilayer wiring structure capable of simultaneously achieving a low dielectric constant and a high thermal conductivity.

Means to Solve the Problem

Hereinbelow, aspects of the present invention will be described.

(First Aspect)

According to a first aspect of the present invention, there is provided a multilayer wiring board having a multilayer wiring structure formed on a substrate including at least one of a semiconductor, a conductor, and an insulator. The multilayer wiring board comprises a gas or an insulating material having a relative dielectric constant of not more than 2.5 on average and interposed between a first wiring layer and a second wiring layer formed above the first wiring layer in the multilayer wiring structure, a conductive connector arranged between at least one wiring of the first wiring layer and at least one wiring of the second wiring layer, and an insulating heat conductor having a relative dielectric constant of not more than 5 and arranged between a predetermined wiring of the first wiring layer and a predetermined wiring of the second wiring layer.

(Second Aspect)

In the multilayer wiring board according to the first aspect mentioned above, it is preferable that, when the insulating material is interposed between the first wiring layer and the second wiring layer, the insulating heat conductor has a thermal conductivity greater than that of the insulating material.

(Third Aspect)

In the multilayer wiring board according to the second aspect mentioned above, the insulating material interposed between the first wiring layer and the second wiring layer may include a material layer containing carbon and fluorine. For example, the material layer is preferably an insulating layer mainly comprising, a fluorocarbon layer.

(Fourth Aspect)

In the multilayer wiring board according to the second aspect mentioned above, the insulating material interposed between the first wiring layer and the second wiring layer may include a material layer containing carbon and hydrogen. For example, the material layer is preferably an insulating layer mainly comprising a hydrocarbon layer or an insulating layer comprising a mixture of a fluorocarbon layer and a hydrocarbon layer.

(Fifth Aspect)

In the multilayer wiring board according to any one of the first through the fourth aspects mentioned above, the insulating heat conductor may include a material containing silicon, carbon, and nitrogen, for example, includes SiCN.

(Sixth Aspect)

According to a sixth aspect of the present invention, there is provided a semiconductor device having a multilayer wiring structure formed on a substrate in which a plurality of semiconductor elements are formed. The semiconductor device comprises a gas or an insulating material having a relative dielectric constant of not more than 2.5 on average and interposed between a first wiring layer and a second wiring layer formed above the first wiring layer in the multilayer wiring structure, a conductive connector arranged between at least one wiring of the first wiring layer and at least one wiring of the second wiring layer, and an insulating heat conductor having a relative dielectric constant of not more than 5 and arranged between a predetermined wiring of the first wiring layer and a predetermined wiring of the second wiring layer.

(Seventh Aspect)

In the semiconductor device according to the sixth aspect, it is preferable that, when the insulating material is interposed between the first wiring layer and the second wiring layer, the insulating heat conductor has a thermal conductivity greater than that of the insulating material.

(Eighth Aspect)

In the semiconductor device according to the seventh aspect, the insulating material interposed between the first wiring layer and the second wiring layer may include a material layer containing carbon and fluorine. For example, the material layer is preferably an insulating layer mainly comprising a fluorocarbon layer.

(Ninth Aspect)

In the semiconductor device according to the seventh aspect, the insulating material interposed between the first wiring layer and the second wiring layer may include a material layer containing carbon and hydrogen. For example, the material layer is preferably an insulating layer mainly comprising a hydrocarbon layer or an insulating layer comprising a mixture of a fluorocarbon layer and a hydrocarbon layer.

(Tenth Aspect)

In the semiconductor device according to any one of the sixth through the ninth aspects, the insulating heat conductor may include a material containing silicon, carbon, and nitrogen, for example, includes SiCN.

EFFECT OF THE INVENTION

According to the present invention, a multilayer wiring structure having a low dielectric constant and a high thermal conductivity can be achieved by interposing, between the first wiring layer and the second wiring layer, a gas or an insulating material having a relative dielectric constant of not more than 2.5 on average, and forming a thermal via by using an insulating heat conductor having a relative dielectric constant of not more than 5.

BEST MODE FOR EMBODYING THE INVENTION

Figure 1:
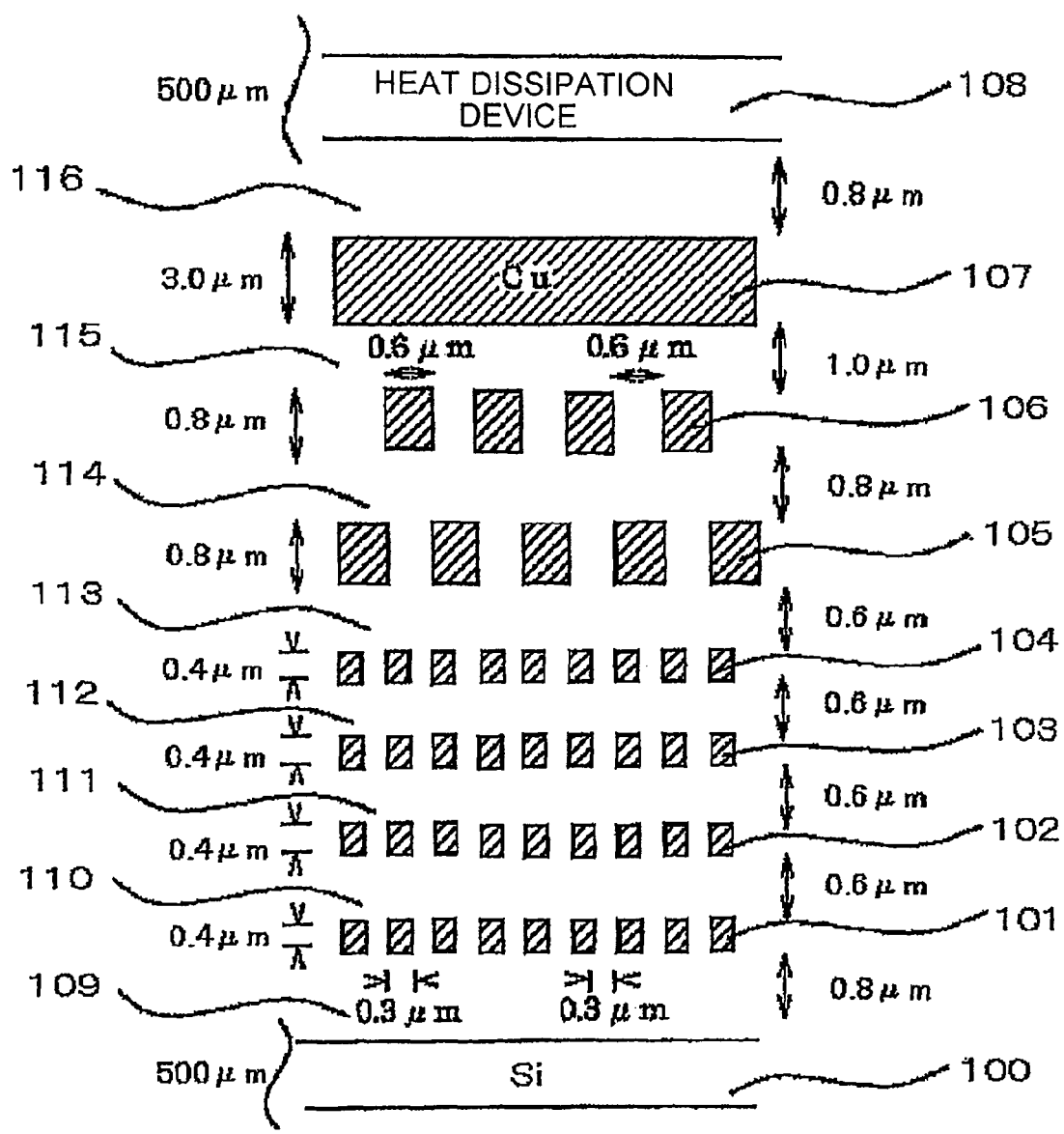
FIG. 1 is a sectional view showing a schematic structure of a semiconductor device to which the present invention is applicable.

Hereinbelow, embodiments of the present invention will be described in detail with reference to the drawing.

A semiconductor device according to a first embodiment of the present invention has, on a substrate including a semiconductor region, at least a first wiring layer and a second wiring layer formed above the first wiring layer. For example, as shown in FIG. 1, the semiconductor device may have seven wiring layers 101 through 107 formed on a silicon substrate 100 and interlayer insulation films 109 through 116 arranged between these layers, between the wiring layer 101 as a bottom layer and the substrate 100, and between the wiring layer 107 as an uppermost layer and a heat dissipation device 108. In FIG. 1, for the sake of convenience, a boundary between each wiring layer and each interlayer insulation film is omitted. Further, a numeric value shown on the left side of each wiring layer and a numeric value shown on the right side of each interlayer insulation film represent examples of a layer thickness and a film thickness, respectively. Numeric values shown on the lower side of the wiring layer 101 and shown on the upper side of the wiring layer 106 represent examples of wiring widths and wiring pitches.

Herein, the semiconductor device means a device comprising electric circuits and electric elements constructed on one substrate at a high density, that is, a device comprising transistors, resistors, capacitors, and the like in an integrated structure. Specifically, the semiconductor device is an IC or an LSI.

As a substrate, besides the silicon substrate with a semiconductor element formed thereon, use may be made of, for example, a metallic substrate, an ordinary semiconductor substrate, an insulator substrate, such as glass and plastic, a metallic substrate coated with an insulator film and thereafter further coated with a semiconductor film, an insulator substrate coated with a semiconductor film, or the like.

For the purpose of enabling the substrate to be used as a conductive substrate, a material (semiconductor material, such as Si and GaAs) forming at least a front surface and/or a rear surface thereof desirably has an electric conductivity of not less than $10^{-8}$ $(\Omega \cdot cm)^{-1}$. Further, the front surface and/or the rear surface of the substrate preferably has a flattest possible surface, since various elements or the like are formed thereon. As the metal, Ta, Ti, W, Co, Mo, Hf, Ni, Zr, Cr, V, Pd, Au, Pt, Mn, Nb, Cu, Ag, or Al is preferable. As the semiconductor, Si, Ge, GaAs, or C (diamond) is preferable. As the insulator coated with the semiconductor film, a mixed film comprising $SiO_2$ (silicon oxide), SiN (silicon nitride), AlN (aluminum nitride), $Al_2O_3$ (aluminum oxide), or $SiO_xN_y$ is preferable. As the metal coated with the insulator film and thereafter further coated with the semiconductor film, Ta, Ti, W, Co, Mo, Hf, Ni, Zr, Cr, V, Pd, Au, Pt, Mn, Nb, Cu, Ag, or Al is preferable.

In a case of the semiconductor device having at least two wiring layers formed on the substrate including the semiconductor region, a metallic wiring, polysilicon, or polycide may be used as a wiring of the first wiring layer and the second wiring layer. A metallic thin film for use in the wiring is formed by vapor deposition or sputtering of metal under high vacuum, or CVD using metal chloride at a high temperature in order to avoid formation of an intermediate layer, such as oxide, between the thin film and a semiconductor surface.

As a material for the metallic thin film, for example, the following materials are listed.

In a Si semiconductor device, use may be made of a material such as Al, Cr, W, Mo, Cu, Ag, Au, Ti, $WSi_2$, $MoSi_2$, $TiSi_2$, or an alloy mainly containing any of the above-mentioned materials (for example, Cu—Mg alloy, Cu—Nb alloy, or Cu—Al alloy), or a wiring comprising a layered structure of the above-mentioned materials (for example, Al—Ti—Al, TiN—Al alloy-TiN, W—Al alloy-W), or the like. Further, in a GaAs semiconductor device, use may be made of a material such as Au, Al, Ni, Pt, or an alloy mainly containing any of the above-mentioned materials.

Especially, for the following reasons, Al, Cu, Ag, Au, or an alloy mainly containing any of the above-mentioned materials is appreciated in the Si semiconductor device.

(A) to form Ohmic contact with an electrode material, (B) to have excellent adhesion with an insulation film ($SiO_2$, $Si_3N_4$, $Al_2O_3$, or the like), (C) to have a high conductivity, (D) to be easy in working and high in working accuracy, and (E) to be chemically, physically, and electrically stable.

Further, the semiconductor device according to the present embodiment has a first insulating material (interlayer insulation film) electrically isolating the first wiring layer and the second wiring layer from each other. Obviously, the interlayer insulation film is arranged between the substrate and the first wiring layer, between the wiring layer and the heat dissipation device 108, and, if there are three or more wiring layers, between these wiring layers.

Figure 2:
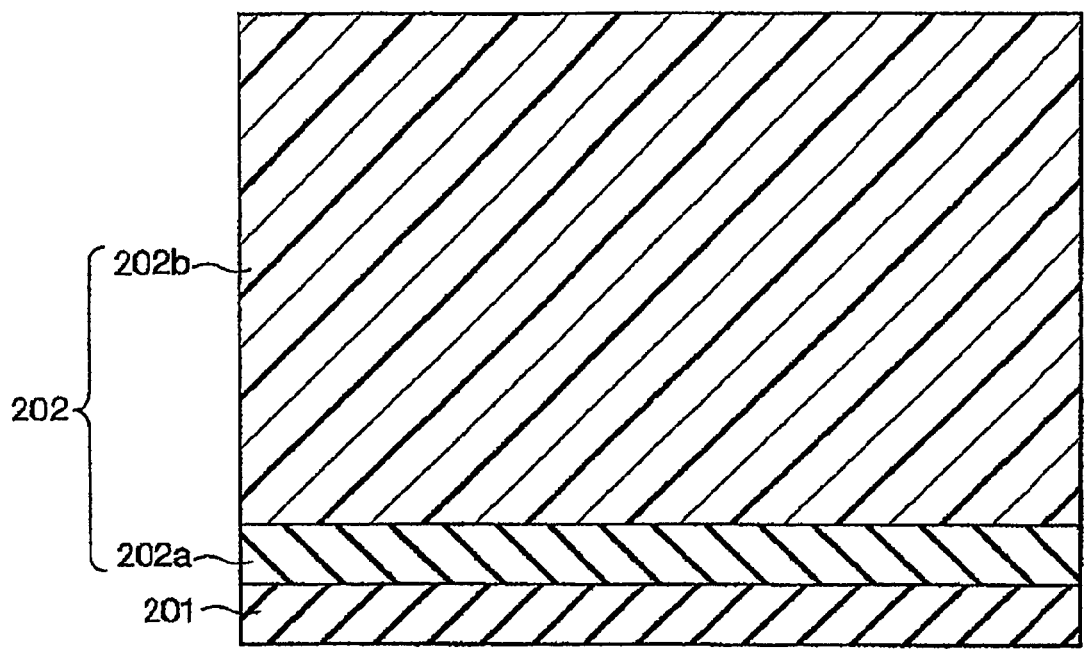
FIG. 2 is a sectional view showing a structure of an interlayer insulation film used in a semiconductor device according to a first embodiment of the present invention.

The first insulating material comprises an underlayer 201 and a CF (fluorocarbon) film 202 formed thereon, as shown in FIG. 2.

The underlayer comprises, for example, a SiCN film, a $Si_3N_4$ film, a SiCO film, a $SiO_2$ film, a CH film, or a multilayer film formed by a combination of the above-mentioned films. These films have a relative dielectric constant of not more than 4. Particularly, the SiCO film has a relative dielectric constant of not more than 3 and the CH film has a relative dielectric constant of not more than 2.5.

For example, the CF film 202 is formed by CVD in which a fluorocarbon gas as a reactive gas is decomposed by a Xe or a Kr plasma. Alternatively, the CF film 202 is formed by CVD in which the fluorocarbon gas is decomposed by an Ar plasma. Alternatively, by sequentially performing the above-mentioned CVDs, a CF film having a double-layered structure (202a and 202b in FIG. 2) may be formed. It is noted here that the CF film formed by the Ar plasma has a relative dielectric constant lower than that of the CF film formed by the Xe or the Kr plasma. In any event, it is possible to lower the relative dielectric constant to a level not more than 2, down to about 1.7

As the fluorocarbon gas, an unsaturated aliphatic fluoride given by a general formula of $C_nF_{2n}$ (n being an integer between 2 and 8) or $C_nF_{2n-2}$ (n being an integer between 2 and 8) may be used. Particularly, fluorocarbon given by a general formula of $C_5F_8$ is preferable, such as carbon fluoride including octafluoropentine, octafuluorobentadiene, octafluorocyclopentene, octafluoromethylbutadiene, octafluoromethylbutyne, fluorocyclopropene, or fluorocyclopropane, or carbon fluoride including fluorocyclobutene or fluorocyclobutane.

For example, in case where the CF film has the double-layered structure, a first CF film is formed to a thickness of 5 to 10 nm by the Xe or the Kr plasma and, subsequently, a second CF film is formed to a thickness of 280 to 500 nm by the Ar plasma.

After the CF film is formed and, preferably, after annealing is thereafter carried out, a $N_2$ gas may be introduced into an Ar gas plasma to generate nitrogen radical (alternatively, a plasma may be produced only by the $N_2$ gas to generate the nitrogen radical). Thus, a surface of the CF film (over a thickness of 1 to 5 nm, preferably 2 to 3 nm) is nitrided to thereby reduce degassing from the surface of the CF film. Consequently, film peeling can be eliminated and a relative dielectric constant can be controlled within a range between 1.7 and 2.2.

If annealing is carried out, it is carried out under an inactive gas atmosphere and, preferably, under a reduced pressure of about 1 Torr (approximately 133 Pa).

A CH film may be used instead of the CF film or laminated on the CF film. The CH film may be controlled to have a low relative dielectric constant of not more than 2.5 as mentioned above. The CH film is deposited by introducing a $C_xH_y$ gas, such as $C_2H_2$ and $C_2H_4$, together with Ar or the like to generate a plasma and performing CVD.

Further, the interlayer insulation film may comprise, on an upper surface of the CF film and/or the CH film thus formed, a $Si_3N_4$ film, a SiCN film, a SiCO film, a CH film, or a multilayer film constituted by a combination thereof.

The interlayer insulation film of the above-mentioned structure is formed so as to have a relative dielectric constant of not more than 2.5 on average (as a whole).

The CF film has a thermal conductivity of 0.13 to 0.21 (W/mK) which is two digits smaller than 10.7 to 6.2 (W/mK) of $SiO_2$. The problem of such a poor thermal conductivity is resolved by a thermal via which will later be described.

In the interlayer insulation film, a penetrating hole (not shown in the figure) is formed in order to establish electrical and thermal connection between wirings of wiring layers (for example, between the wirings of the first wiring layer and the second wiring layer) positioned on upper and lower sides of the interlayer insulation film. The penetrating hole is also called a via hole and, generally, can be formed by a technique called photo-etching. A hole diameter is determined on the basis of widths of the wirings positioned on the upper and the lower sides. The penetrating hole is used as a through hole for electrical connection between the wirings or as a dummy hole for thermal connection between the wirings.

The through hole (conductive connector) is formed by filling the penetrating hole formed in the interlayer insulation film with a conductive material. The through hole functions to establish electrical connection between the wirings positioned on the upper and the lower sides and electrically isolated by the first insulating material. Therefore, the through hole is arranged only at a position necessary in circuit formation and can not be arranged at an arbitrary position. The through hole may be formed by a known technique. It is noted here that the through hole can transmit not only an electric signal but also heat.

The dummy hole (insulating heat conductor) is formed by filling the penetrating hole formed in the interlayer insulation film with a second insulating material having a thermal conductivity greater than that of the first insulating material. Between the wirings electrically isolated by the first insulating material and positioned on the upper and the lower sides, the dummy hole can transmit heat, from one wiring to the other wiring, faster than the first insulating material. Therefore, the dummy hole is also called a thermal via. By forming the thermal via, in case where one wiring is elevated in temperature, heat can quickly be transmitted to the other wiring to promote heat dissipation. Thus, an abnormal temperature elevation of each wiring can be suppressed. The dummy hole is an insulating material and, therefore, does not transmit an electric signal. Therefore, the dummy hole can be formed at an arbitrary position.

As the second insulating material, SiCN is used. SiCN has a thermal conductivity as high as approximately 100 W/mK. Therefore, even if the CF film is used as the interlayer insulation film, sufficient heat conduction can be achieved. Further, SiCN has a relative dielectric constant of not more than 5 (about 4.0) and does not drastically increase an average relative dielectric constant of the interlayer insulation film.

For example, SiCN may be formed by plasma processing using $SiH_4/C_2H_4/N_2$. Instead of a silane gas ($SiH_4$)/ethylene ($C_2H_4$), organic silane may be used.

The uppermost layer of the semiconductor device of the present embodiment may be provided with the heat dissipation device 108. The heat dissipation device is, for example, a conductive film, a fin structure, or the like, which is made of a material (for example, Ag, Cu, Au, Al, Ta, or Mo) having a high thermal conductivity.

With the structure mentioned above, it is possible to ensure a high-speed operation by reducing a substantial relative dielectric constant of the interlayer insulating material and to suppress temperature elevation of the wiring to thereby improve the reliability of the wiring by introducing the dummy holes of SiCN having a high thermal conductivity at key points between the wirings. In place of SiCN, use may be made of an insulating material having a dielectric constant of not more than 5 and a thermal conductivity greater than those of the CF film and the CH film.

Next, a second embodiment of the present invention will be described.

Figure 3:
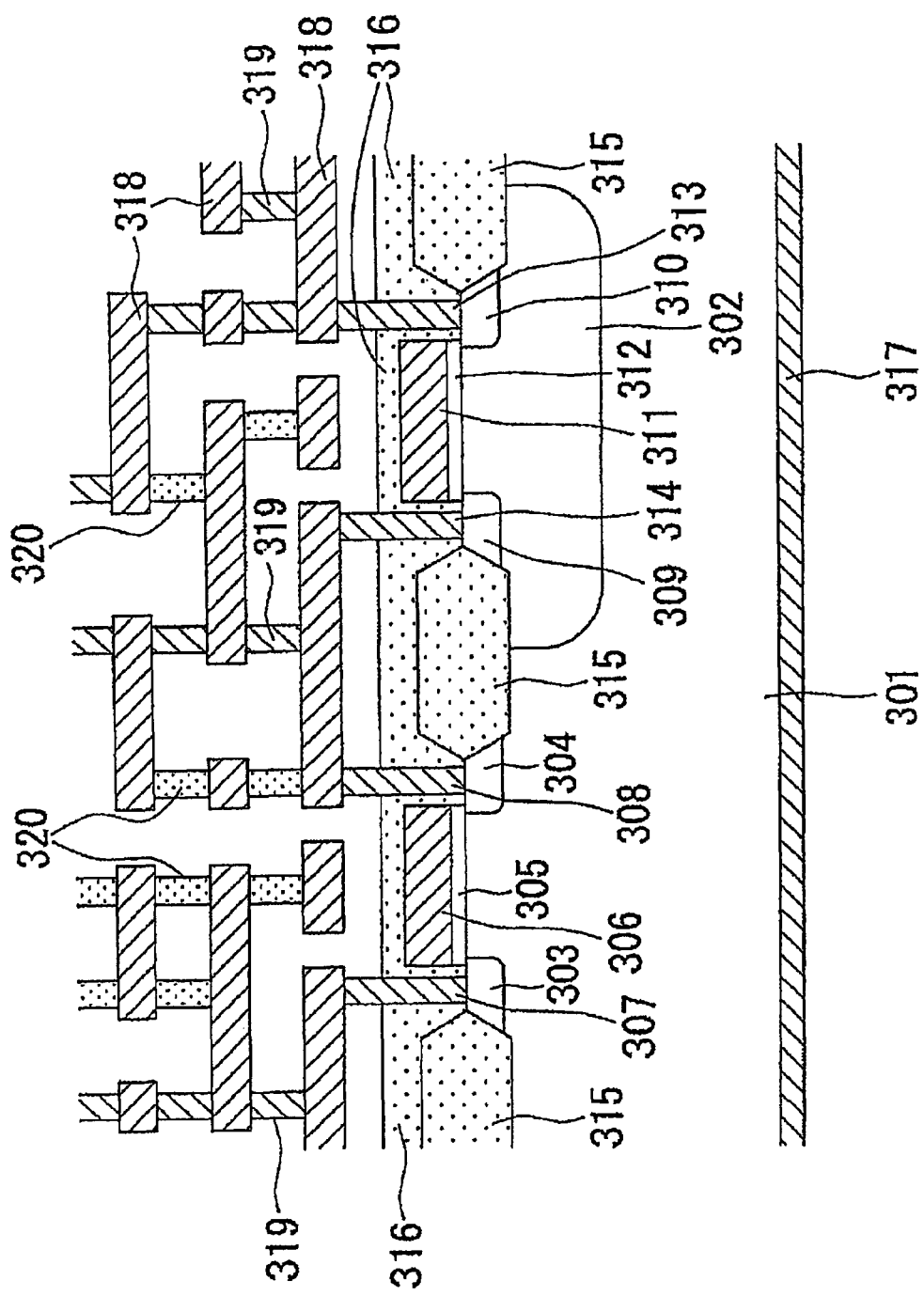
FIG. 3 is a partial sectional view showing a structure of semiconductor device according to a second embodiment of the present invention.

FIG. 3 shows a partial structure of a semiconductor device according to the second embodiment of the present invention. The semiconductor device shown in the figure is an integrated circuit having a multilayer wiring structure in which an interlayer insulation film between wiring layers is removed except thermal vias (corresponding to the dummy holes in the first embodiment) and interlayer insulation is achieved by a gas.

In detail, the semiconductor device includes a p-type substrate 301, a CMOS-forming n-well 302, an nMOS source region 303, an nMOS drain region 304, an nMOS gate insulation film 305, an nMOS gate electrode 306, an nMOS source electrode 307, and an nMOS drain electrode 308. The semiconductor device further includes a pMOS drain region 309, a pMOS source region 310, a pMOS gate insulation film 312, a pMOS gate electrode 311, a pMOS source electrode 313, and a pMOS drain electrode 314. The semiconductor device further includes an element isolation region ($SiO_2$ or the like) 315, an insulation film ($SiO_2$ or the like) 316 formed on an upper surface thereof, a rear surface electrode 317 formed on a rear surface of the p-type substrate 301, one or more layer of a metallic wiring 318, conductive vias (corresponding to the through holes in the first embodiment) 319, and thermal vias 320.

In FIG. 3, the thermal vias 320 are shown to connect the metallic wirings 318 adjacent to each other in a vertical direction in the figure. However, in order to enhance a structural intensity, the thermal vias may connect the metallic wirings 318 adjacent to each other in a horizontal direction in the figure.

The semiconductor device in FIG. 3 uses Cu as the metallic wirings. A Cu wiring has a giant grain structure in order to reduce its resistivity. With the above-mentioned metallic wirings and interlayer insulation using a gas, a signal delay in each wiring can be reduced to about one-eighth. This is because, while BPSG (Boron-doped Phosphor-Silicate Glass) as a typical interlayer insulation film has a relative dielectric constant of about 4.0, the gas (desirably, He having a high thermal conductivity) has a relative dielectric constant as low as 1.0.

Each of the metallic wirings 318 and the conductive vias 319 has a surface covered with nitride (titanium nitride, tantalum nitride, silicon nitride, or the like) which is not shown in the figure.

The conductive vias 319 are inserted at positions determined by a circuit design. On the other hand, the thermal vias 320 can be inserted at arbitrary positions and the insert positions are determined on the basis of a structural strength, a degree of temperature elevation of the wiring, and so on.

Next, a method of manufacturing the semiconductor device in FIG. 3 will be described.

The semiconductor device is obtained by manufacturing a semiconductor device (semifinished product) having the BPSG as the interlayer insulation film and by thereafter removing the BPSG. Therefore, the semifinished product is manufactured in a manner similar to that of a conventional semiconductor device. Formation of the thermal via and the conductive via is performed as follows.

First, a method of forming the thermal via will be described.

Figure 4A:
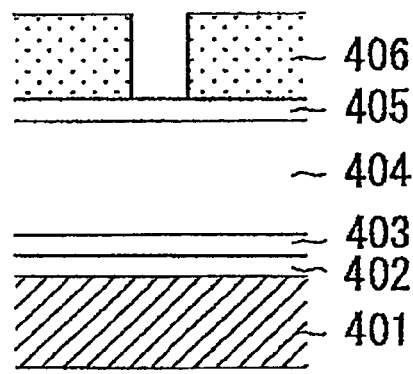
FIG. 4A is a view for describing a formation technique of a thermal via of the semiconductor device illustrated in FIG. 3.

As shown in FIG. 4A, it is assumed that, on a Cu (alloy) wiring 401, a conductive nitride film (TiN, TaN, or the like) 402 for stabilizing a surface of the Cu wiring 401, a thin $Si_3N_4$ 403, a BPSG 404, a $Si_3N_4$ 405, and a photoresist 406 as a via hole forming pattern are sequentially formed. The $Si_3N_4$ 403, the BPSG 404, and the $Si_3N_4$ 405 correspond to the interlayer insulation film.

Figure 4B:
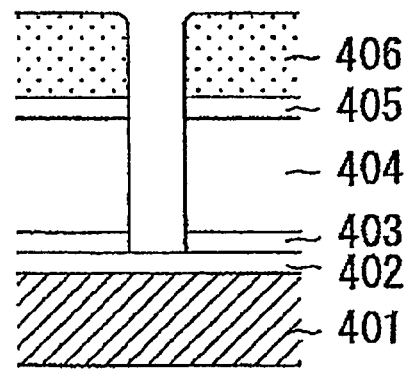
FIG. 4B is a view for describing the formation technique of the thermal via of the semiconductor device illustrated in FIG. 3.

Next, by a balanced electron drift (BED) magnetron plasma RIE device, the $Si_3N_4$ 403, the BPSG 404, and the $Si_3N_4$ 405 are etched by using a $C_4F_8/CO/O_2/Ar$ gas. As a result, a state shown in FIG. 4B is obtained. By carrying out a final process of etching (process of etching a remainder of the $Si_3N_4$ 405) by using a $C_4F_8/CO/O_2/Xe$ (or Kr) gas, a surface damage caused to the conductive nitride film 402 can sufficiently be reduced.

Figure 4C:
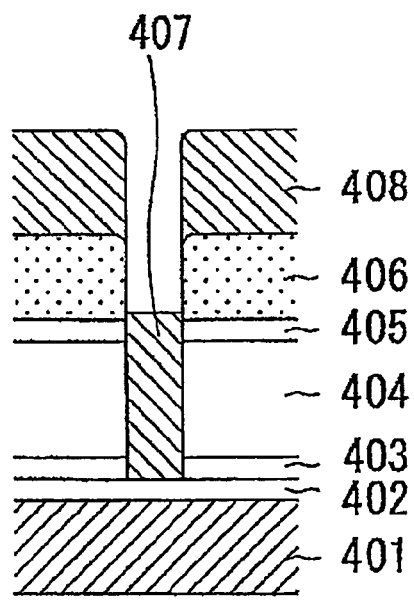
FIG. 4C is a view for describing the formation technique of the thermal via of the semiconductor device illustrated in FIG. 3.

Next, by plasma processing using $SiH_4/C_2H_4/N_2$, SiCN 407 and 408 are deposited, as shown in FIG. 4C. Instead of the silane gas ($SiH_4$)/ethylene ($C_2H_4$), organic silane may be used.

Figure 4D:
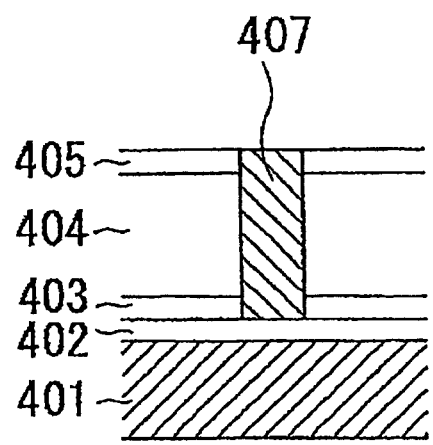
FIG. 4D is a view for describing the formation technique of the thermal via of the semiconductor device illustrated in FIG. 3.

Subsequently, by using an IPA (about 30%)/KF (about 10%)/$H_2O$ solution, irradiation of a megasonic ultrasonic wave of about 0.5 to 3 MHz is carried out. Then, the photoresist 406 is peeled off from the $Si_3N_4$ 405, as shown in FIG. 4D. As a result, the SiCN 408 deposited on the photoresist 406 is removed by liftoff. If necessary, planarization, such as CMP (Chemical Mechanical Polishing), is performed.

As mentioned above, it is possible to form a thermal via (SiCN) 407 in the BPSG 404.

In a case where the air is interposed between the wiring layers, the air has a thermal conductivity of 0.0241 (W/mK) which is three digits smaller than 10.7 to 6.2 (W/mK) of $SiO_2$. However, SiCN has a thermal conductivity of approximately 100 (W/mK), so that heat conduction between the wiring layers can sufficiently be carried out. Further, SiCN has a relative dielectric constant of about 4 and, therefore, does not drastically increase an average relative dielectric constant of an interlayer insulation portion (space).

Next, a process of forming the conductive via and the wiring will be described. In formation of the conductive via and the wiring, a damascene or a dual damascene process is used. For the wiring, Cu is used as mentioned in the foregoing. For the conductive via, although Al or an Al alloy may be used, description will be made of a case where Cu same as the wiring is used.

By using a two-stage shower plate microwave plasma device, a via hole is formed in the $Si_3N_4$ 403, the BPSG 404, and the $Si_3N_4$ 405, like in FIG. 4B.

Next, in the above-mentioned device, a high-frequency power of a substrate electrode is turned into zero and a gas to be introduced is changed to $He/O_2$, $Kr/O_2$, $Kr/H_2O$, or the like. A microwave is applied through a RLSA (Radial Line Slot Antenna). Thus, a large amount of O* and OH* are generated to remove a thin fluorocarbon film deposited on a surface and on a wall surface of the via hole.

Figure 5A:
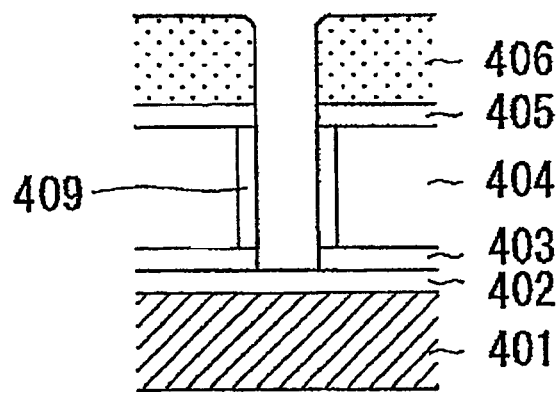
FIG. 5A is a view for describing a formation technique of a conductive via of the semiconductor device illustrated in FIG. 3.

Next, for the purpose of forming, on the wall surface of the via hole in the BPSG 404, a nitride film for suppressing diffusion of Cu, a gas, such as $NH_3/Ar$ (or Kr) or $N_2/H_2/Ar$ (or Kr), is flowed and a high-density plasma is excited by a microwave. As a result, a large amount of NH* is generated so that the wall surface of the via hole in the BPSG 404 is changed into $Si_3N_4$ 409 over a thickness of about 5 to 20 nm, as shown in FIG. 5A.

Figure 5B:
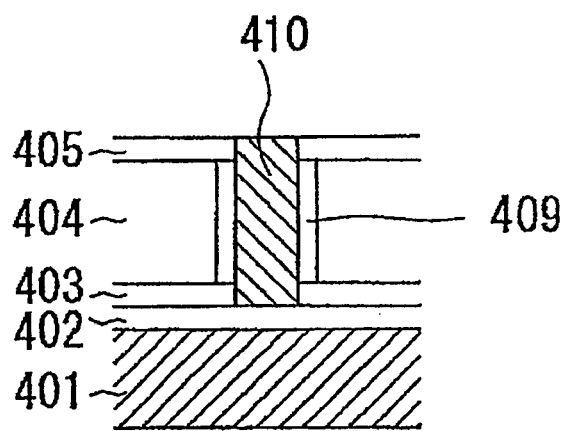
FIG. 5B is a view for describing the formation technique of the conductive via of the semiconductor device illustrated in FIG. 3.

In this state, a noble gas, such as Ar, Kr, and Xe, is supplied from a first-stage shower plate and Cu(hgac)(tmvs), Cu(hgac)(teovs), or the like as a supply source of Cu is supplied, together with an Ar carrier gas, from a second-stage shower plate. Plasma excitation by the microwave is carried out at a position directly below the first-stage shower plate and at a distance of several mm therefrom, while the second-stage shower plate is arranged in a diffusion plasma area. Therefore, a raw material gas is not excessively decomposed. Due to collision with Ar+, Kr+, Xe+, or Ar*, Kr*, Xe*, most of the raw material gas is excited or ionized. After surface adsorption, a Cu film is deposited by ion irradiation. Cu is subjected to CMP or grinding using a diamond grinding surface obtained by forming a diamond thin film of several μm on a silicon block surface and thereafter forming a groove pattern for polishing. Thereafter, cleaning by oxalic acid $(COOH)_2$ is carried out. As a result, the conductive via filled with Cu 410 is formed, as shown in FIG. 5B.

The Cu 410 is surrounded by the $Si_3N_4$ 409, so that diffusion of Cu to the BPSG 404 is prevented.

Incidentally, on a surface of the Cu 410, TiN or TaN may be selectively deposited to a thickness of about 5 to 10 nm by thermal CVD. Then, oxidation thereof is prevented.

Thus, it is possible to obtain a semifinished product having the BPSG as the interlayer insulation film and provided with the thermal via and the conductive via formed at predetermined positions of the BPSG.

Next, by using a gas, such as $N_2$ and Ar, having an amount of moisture at least reduced to 1 ppm with an anhydrous HF gas of 1 to 7% added thereto, only the BPSG as the interlayer insulation film is selectively removed.

HF molecules dissolve in water to generate $HF_2^-$ ions which etch $SiO_2$. Therefore, when the BPSG is removed, moisture adsorbed on a wafer surface is at least removed to a level below a monomolecular layer. For example, a wafer is subjected to baking (not lower than 200° C., desirably not lower than 300° C.) under a $N_2$ gas atmosphere containing an amount of moisture of not more than 1 ppm. Thereafter, a temperature of the wafer is kept at 120 to 140° C. so that water ($H_2O$) produced by a reaction between the BPSG and HF is not adsorbed to the wafer surface.

When a concentration of the HF gas is too low, an etching rate becomes too slow. On the other hand, when the concentration is too high, a part, such as $SiO_2$, except BPSG is started to be etched.

The wiring is covered with $Si_3N_4$, TaN, TiN, or the like. Since these nitrides do not react with the HF gas, the wiring is not etched.

As described above, the semiconductor device of FIG. 3 can be manufactured.

INDUSTRIAL APPLICABILITY

In the foregoing, the embodiments have been described in the case of the semiconductor device. However, it will readily be understood that the present invention is applicable to multilayer wiring boards in general which has a multilayer wiring structure formed on a substrate including at least one of a semiconductor, a conductor, and an insulator.

The invention claimed is:

1. A multilayer wiring board having a multilayer wiring structure formed on a substrate including at least one of a semiconductor, a conductor, and an insulator, the multilayer wiring board comprising:
a gas or an insulating material having a relative dielectric constant of not more than 2.5 on average and interposed between a first wiring layer and a second wiring layer formed above the first wiring layer in the multilayer wiring structure; a conductive connector arranged between at least one wiring of the first wiring layer and at least one wiring of the second wiring layer; and an insulating heat conductor having a relative dielectric constant of not more than 5 and arranged between a predetermined wiring of the first wiring layer and a predetermined wiring of the second wiring layer,
wherein the insulating heat conductor includes a material containing silicon, carbon, and nitrogen.

2. The multilayer wiring board as claimed in claim 1, wherein the insulating material is interposed between the first wiring layer and the second wiring layer and the insulating heat conductor has a thermal conductivity greater than the thermal conductivity of the insulating material.

3. The multilayer wiring board as claimed in claim 2, wherein the insulating material interposed between the first wiring layer and the second wiring layer includes a material containing carbon and fluorine.

4. The multilayer wiring board as claimed in claim 2, wherein the insulating material interposed between the first wiring layer and the second wiring layer includes a material containing carbon and hydrogen.

5. The multilayer wiring board as claimed in claim 1, wherein the insulating heat conductor includes SiCN.

6. A semiconductor device having a multilayer wiring structure formed on a substrate in which a plurality of semiconductor elements are formed, the semiconductor device comprising:

a gas or an insulating material having a relative dielectric constant of not more than 2.5 on average and interposed between a first wiring layer and a second wiring layer formed above the first wiring layer in the multilayer wiring structure; a conductive connector arranged between at least one wiring of the first wiring layer and at least one wiring of the second wiring layer; and an insulating heat conductor having a relative dielectric constant of not more than 5 and arranged between a predetermined wiring of the first wiring layer and a predetermined wiring of the second wiring layer, wherein the insulating heat conductor includes a material containing silicon, carbon, and nitrogen.

7. The semiconductor device as claimed in claim 6, wherein the insulating material is interposed between the first wiring layer and the second wiring layer and the insulating heat conductor has a thermal conductivity greater than the thermal conductivity of the insulating material.

8. The semiconductor device as claimed in claim 7, wherein the insulating material interposed between the first wiring layer and the second wiring layer includes a material containing carbon and fluorine.

9. The semiconductor device as claimed in claim 7, wherein the insulating material interposed between the first wiring layer and the second wiring layer includes a material containing carbon and hydrogen.

10. The semiconductor device as claimed in claim 6, wherein the insulating heat conductor includes SiCN.

* * * * *